(12) United States Patent
Takaki et al.

(10) Patent No.: US 11,624,767 B2
(45) Date of Patent: Apr. 11, 2023

(54) SEMICONDUCTOR TEST APPARATUS AND SEMICONDUCTOR TEST METHOD

(71) Applicant: Mitsubishi Electric Corporation, Tokyo (JP)

(72) Inventors: Yasushi Takaki, Tokyo (JP); Kinya Yamashita, Tokyo (JP); Masaki Ueno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/386,032

(22) Filed: Jul. 27, 2021

(65) Prior Publication Data

US 2022/0128616 A1 Apr. 28, 2022

(30) Foreign Application Priority Data

Oct. 27, 2020 (JP) .............................. JP2020-179378

(51) Int. Cl.
*G01R 31/26* (2020.01)
*G01R 1/073* (2006.01)

(52) U.S. Cl.
CPC ..... *G01R 31/2601* (2013.01); *G01R 1/07342* (2013.01)

(58) Field of Classification Search
CPC ............ G01R 1/07342; G01R 31/2601; G01R 1/073; G01R 31/26; H01L 21/66
USPC .................................................. 324/750.03
See application file for complete search history.

(56) References Cited

U.S. PATENT DOCUMENTS

| | | | |
|---|---|---|---|
| 8,860,451 B2 | 10/2014 | Kaguchi et al. | |
| 2007/0247177 A1* | 10/2007 | Ruckenbauer | G01R 31/2891 |
| | | | 324/750.19 |
| 2017/0059442 A1* | 3/2017 | Mcclanahan | G01M 3/3272 |

FOREIGN PATENT DOCUMENTS

| | | | | |
|---|---|---|---|---|
| JP | 2008192861 A | * | 8/2008 | ............. G01R 31/26 |
| JP | 5414739 B2 | | 2/2014 | |
| JP | 2018-160591 A | | 10/2018 | |
| JP | 6504971 B2 | | 4/2019 | |

OTHER PUBLICATIONS

English translation of JP2008192861A (Year: 2008).*

* cited by examiner

*Primary Examiner* — Lee E Rodak
*Assistant Examiner* — Courtney G McDonnough
(74) *Attorney, Agent, or Firm* — Studebaker & Brackett PC

(57) ABSTRACT

A semiconductor test apparatus according to the present disclosure includes: a stage on which a wafer is to be mounted; a pressurizing wall disposed on a surface of a probe card opposing the stage, extending toward the stage, and having an opening; a mark disposed on a lower surface of the pressurizing wall opposing the stage; a probe disposed in the opening; an air tube to force air into the opening; a detector to detect first spacing between a tip of the probe and the mark; and a controller to control second spacing between the wafer and the lower surface of the pressurizing wall based on the first spacing, wherein, when an electrical property of each of chips of the wafer is measured, the second spacing is controlled to be predetermined spacing by the controller, and the air is forced into the opening through the air tube.

8 Claims, 8 Drawing Sheets

F I G. 1
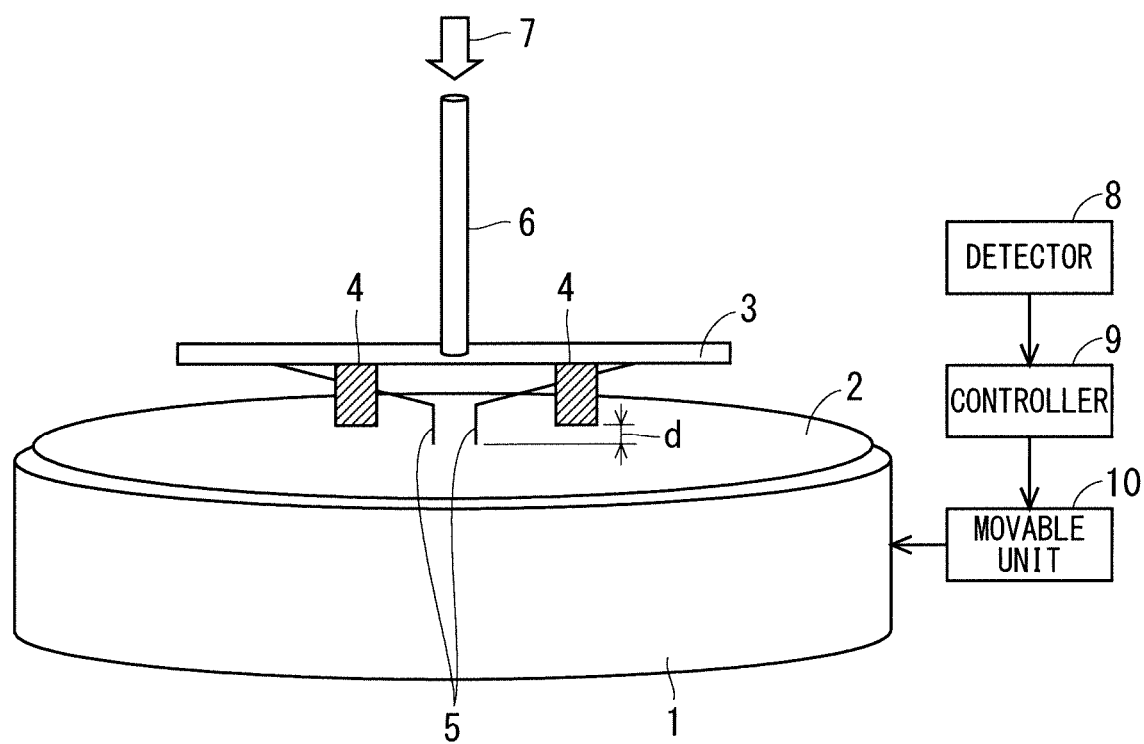

F I G. 4
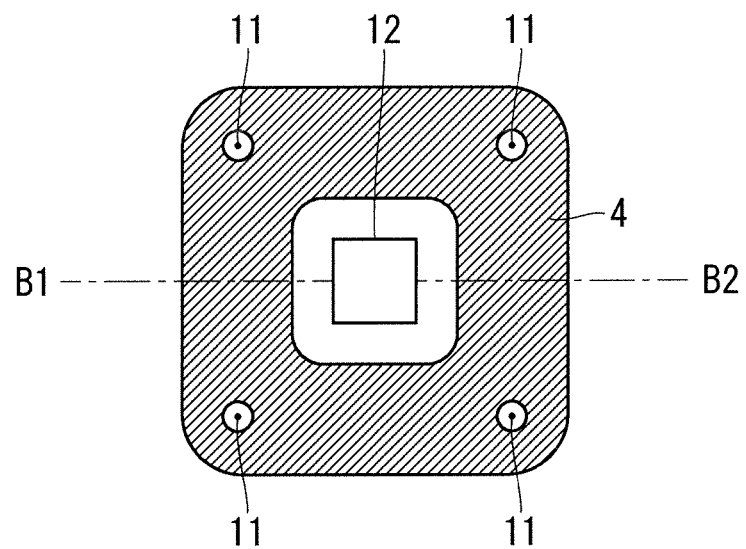
F I G. 5
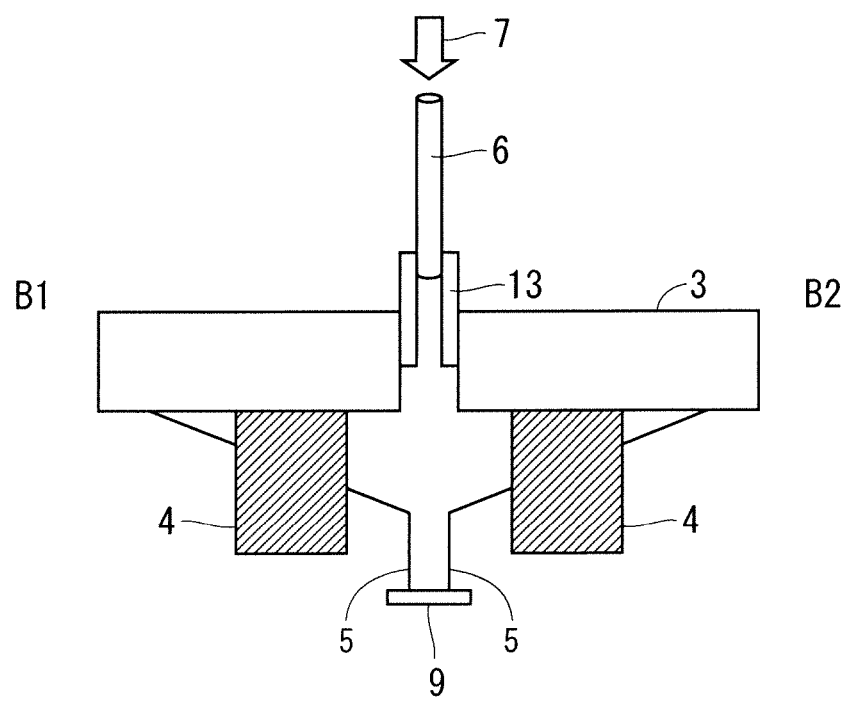

F I G. 8
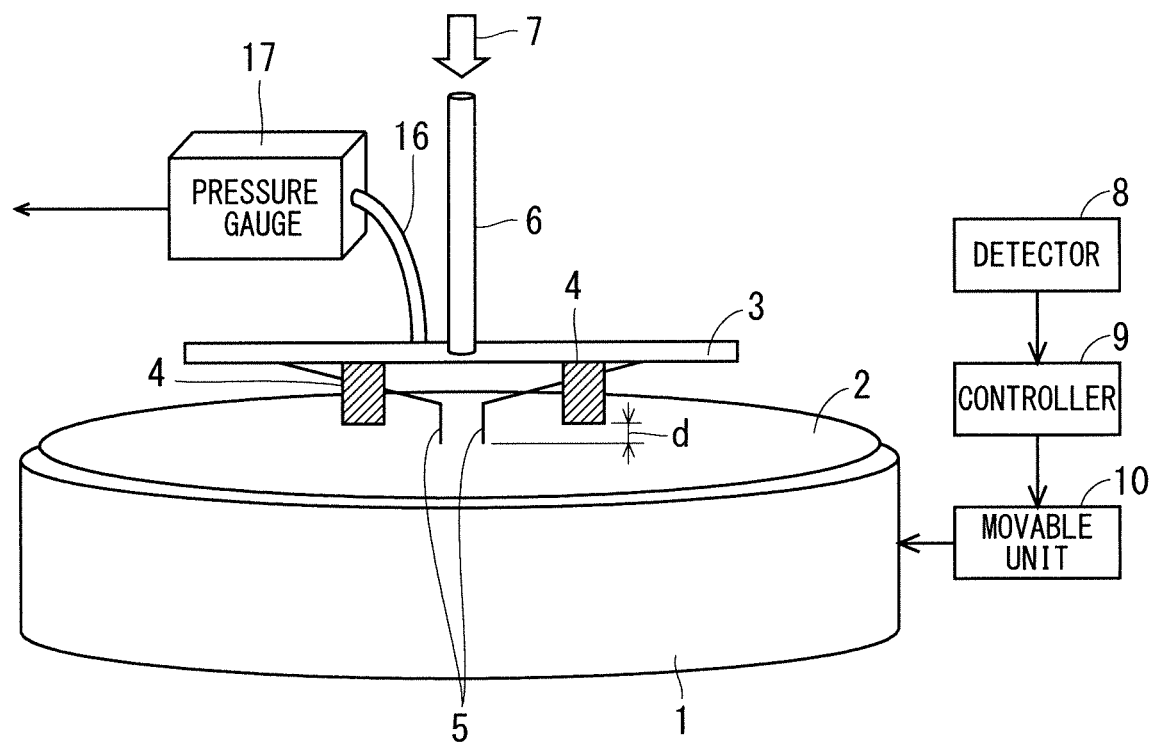

SEMICONDUCTOR TEST APPARATUS AND SEMICONDUCTOR TEST METHOD

BACKGROUND OF THE INVENTION

Field of the Invention

The present disclosure relates to a semiconductor test apparatus and a semiconductor test method to conduct a breakdown voltage test on semiconductor devices while they are in wafer form.

Description of the Background Art

Various methods have been devised as a method for suppressing a discharge in a terminal portion of a semiconductor device when the terminal portion is shrunk to conduct a breakdown voltage test (see Japanese Patent No. 5414739, for example). In Japanese Patent No. 5414739, an insulator is pressed against a terminal portion of a semiconductor device in chip form to suppress a discharge in the terminal portion.

In technology disclosed in Japanese Patent No. 5414739, it is necessary to conduct a breakdown voltage test after a wafer is diced to obtain semiconductor devices in chip form. In this case, the breakdown voltage test is conducted on individual semiconductor devices after dicing, so that an apparatus might become complex and increase in size to conduct the breakdown voltage test on a plurality of semiconductor devices simultaneously. On the other hand, if the breakdown voltage test can be conducted on semiconductor devices while they are in wafer form, it is easy to conduct the breakdown voltage test on a plurality of semiconductor devices simultaneously.

SUMMARY

It is an object of the present disclosure to provide a semiconductor test apparatus and a semiconductor test method enabling a breakdown voltage test conducted on semiconductor devices while they are in wafer form.

A semiconductor test apparatus according to the present disclosure includes: a stage on which a wafer including a plurality of subjects is to be mounted; a probe card disposed above the stage; a pressurizing wall disposed on a surface of the probe card opposing the stage, extending toward the stage, and having an opening; a mark disposed on a lower surface of the pressurizing wall, the lower surface being a surface of the pressurizing wall opposing the stage; a probe disposed in the opening; a tube to force air into the opening; a detector to detect first spacing between a tip of the probe and the mark; and a controller to control second spacing between the wafer and the lower surface of the pressurizing wall based on the first spacing detected by the detector, wherein, when an electrical property of each of the subjects of the wafer is measured, the second spacing is controlled to be predetermined spacing by the controller, and the air is forced into the opening through the tube.

According to the present disclosure, a breakdown voltage test can be conducted on semiconductor devices while they are in wafer form.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates an example of a configuration of a semiconductor test apparatus according to an embodiment;

FIG. 4 illustrates the pressurizing wall according to the embodiment as viewed from the side of the stage;

FIG. 5 is a cross-sectional view taken along the line B1-B2 of FIG. 4;

FIG. 8 illustrates an example of a configuration of the semiconductor test apparatus according to the embodiment;

DESCRIPTION OF THE PREFERRED EMBODIMENTS

<Configuration of Semiconductor Test Apparatus>

Figure 2:
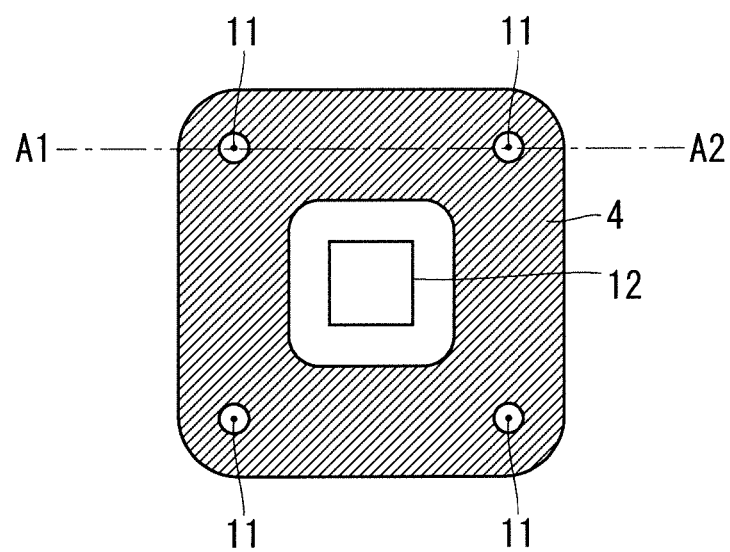
FIG. 2 illustrates a pressurizing wall according to the embodiment as viewed from a side of a stage.

FIG. 1 illustrates an example of a configuration of a semiconductor test apparatus according to an embodiment. The semiconductor test apparatus is an apparatus to conduct a breakdown voltage test on semiconductor devices while they are in wafer form, and is an apparatus to perform measurement while increasing pressure around probes to suppress a discharge when a high breakdown voltage of 1200 V or more is measured, for example.

As illustrated in FIG. 1, the semiconductor test apparatus includes a stage 1, a probe card 3, an air tube 6, a detector 8, a controller 9, and a movable unit 10.

A wafer 2 including a plurality of subjects is mountable on the stage 1. The probe card 3 is disposed above the stage 1. A pressurizing wall 4 extending toward the stage 1 and having an opening is disposed on a surface of the probe card 3 opposing the stage 1.

Figure 3:
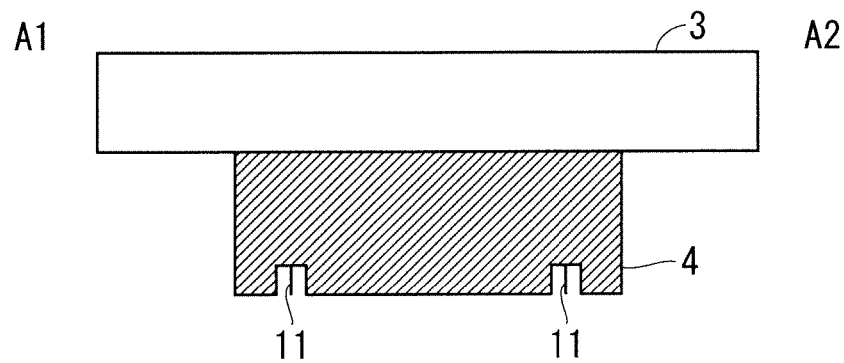
FIG. 3 is a cross-sectional view taken along the line A1-A2 of FIG. 2.

FIG. 2 illustrates the pressurizing wall 4 as viewed from a side of the stage 1. FIG. 3 is a cross-sectional view along the line A1-A2 of FIG. 2. The pressurizing wall 4 has the opening to enclose a chip 12 (subject) in plan view. The chip 12 is a semiconductor device.

While a portion of the pressurizing wall 4 is not illustrated in FIG. 1 for ease of description, the pressurizing wall 4 actually has the opening as illustrated in FIG. 2. The same applies to FIGS. 7 to 10 described below. While a single chip 12 is illustrated in FIG. 2 for ease of description, a plurality of chips 12 are actually formed in the wafer 2. Furthermore, the shape of the pressurizing wall 4 in plan view is not limited to the shape illustrated in FIG. 2. The pressurizing wall 4 is only required to have an annular shape having an opening.

Four marks 11 are arranged on a lower surface of the pressurizing wall 4 (surface of the pressurizing wall 4 opposing the stage 1). The marks 11 are used when the detector 8, which will be described below, measures a height of the lower surface of the pressurizing wall 4, so that tips of the marks 11 are flush with the lower surface of the pressurizing wall 4. Specifically, the marks 11 are formed by providing the lower surface of the pressurizing wall 4 with grooves, and embedding needles of metal at the centers of the grooves.

The number of marks 11 and the locations of the marks 11 are not limited to the number and the locations shown in FIG. 2. The shape of the marks 11 is not limited to the shape shown in FIG. 2. The marks 11 are only required to have tips flush with the lower surface of the pressurizing wall 4.

FIG. 4 illustrates the pressurizing wall 4 as viewed from the side of the stage 1. FIG. 5 is a cross-sectional view along the line B1-B2 of FIG. 4. The air tube 6 is connected to a through hole of the probe card 3 through a joint 13. Air 7 at pressure regulated by an electropneumatic regulator, which is not illustrated, is forced into the opening of the pressurizing wall 4 through the air tube 6, the joint 13, and the through hole of the probe card 3.

Referring back to FIG. 1, conductive probes 5 are arranged on the probe card 3. Tips of the probes 5 (portions to be in contact with the subjects at measurement) are located in the opening of the pressurizing wall 4.

The detector 8 detects a clearance d (first spacing) between the tips of the probes 5 and the marks 11 arranged on the lower surface of the pressurizing wall 4. The detector 8 is a camera, for example. The controller 9 controls movement of the movable unit 10 based on a detection result received from the detector 8. Specifically, the controller 9 controls second spacing between the wafer 2 and the lower surface of the pressurizing wall 4 based on the first spacing detected by the detector 8.

The movable unit 10 moves the stage 1 toward or away from the probe card 3. The movable unit 10 may move not the stage 1 but the probe card 3, or may move both the stage 1 and the probe card 3 simultaneously.

<Semiconductor Test Method>

Figure 6:
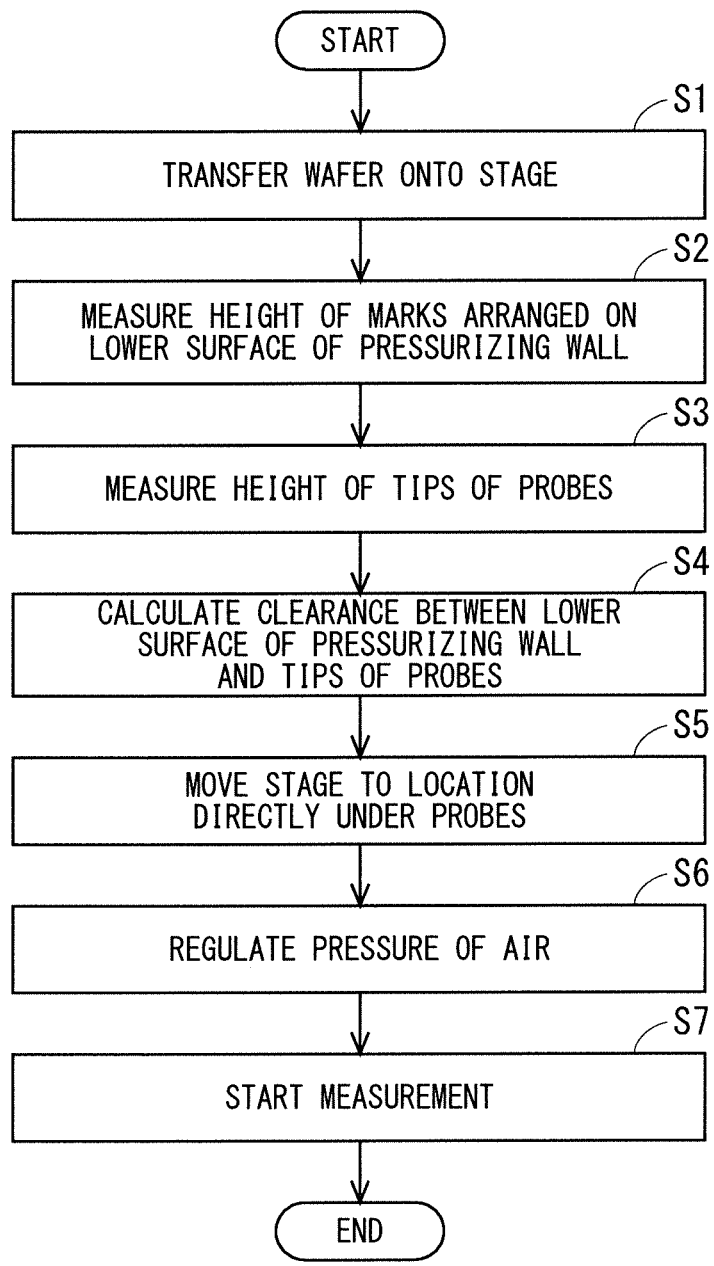
FIG. 6 is a flowchart showing an example of a semiconductor test method according to the embodiment.

FIG. 6 is a flowchart showing an example of a semiconductor test method performed using the semiconductor test apparatus.

In step S1, the wafer 2 is transferred onto the stage 1. The wafer 2 is thereby mounted on the stage 1.

In step S2, the detector 8 measures a height from the surface of the wafer 2 to the tips of the marks 11 arranged on the lower surface of the pressurizing wall 4 (a height from the surface of the wafer 2 to the lower surface of the pressurizing wall 4). When there are the four marks 11 as illustrated in FIG. 2, the marks 11 vary in height. In this case, the detector 8 measures an average value of the height of the marks 11 as the height of the marks 11. The detector 8 stores coordinates of the locations of the marks 11 in advance, and can measure the height of the marks 11 based on the coordinates of the locations.

In step S3, the detector 8 measures a height from the surface of the wafer 2 to the tips of the probes 5. The detector 8 may measure an average value of the height of the tips of the plurality of probes 5 as the height of the tips of the probes 5, or may measure the height of a tip of one representative probe 5.

In step S4, the detector 8 calculates the clearance (first spacing) between the lower surface of the pressurizing wall 4 and the tips of the probes 5 based on the height of the lower surface of the pressurizing wall 4 measured by the detector 8 in step S2 and the height of the tips of the probes 5 measured by the detector 8 in step S3. The controller 9 calculates a clearance (the second spacing) between the wafer 2 and the lower surface of the pressurizing wall 4 based on the first spacing.

When it is assumed that the clearance (first spacing) between the lower surface of the pressurizing wall 4 and the tips of the probes 5 is 200 μm, and the amount of overdrive after the tips of the probes 5 are in contact with the wafer 2 is 100 μm, for example, the clearance (second spacing) between the wafer 2 and the lower surface of the pressurizing wall 4 at measurement is 100 μm. In the present embodiment, the clearance (first spacing) between the lower surface of the pressurizing wall 4 and the tips of the probes 5 is designed to be 150 μm to 210 μm, and the clearance (second spacing) between the wafer 2 and the lower surface of the pressurizing wall 4 at measurement is 50 μm to 130 μm.

The clearance (second spacing) is provided between the wafer 2 and the lower surface of the pressurizing wall 4 to prevent damage in the surface of the wafer 2 caused by contact of the lower surface of the pressurizing wall 4 with the wafer 2. An increase in clearance (second spacing) between the wafer 2 and the lower surface of the pressurizing wall 4, however, allows much of the air 7 forced into the opening of the pressurizing wall 4 through the air tube 6 to escape from the pressurizing wall 4, so that pressure in the opening cannot sufficiently be increased. A clearance (second spacing) between the wafer 2 and the lower surface of the pressurizing wall 4 at measurement of 50 μm to 130 μm is thus appropriate.

After it is confirmed that the clearance (second spacing) between the wafer 2 and the lower surface of the pressurizing wall 4 at measurement is 50 μm or more in step S4, the movable unit 10 moves the stage 1 so that the stage 1 is located directly under the probe card 3 in step S5.

In step S6, the air 7 at pressure regulated by the electropneumatic regulator is forced into the opening of the pressurizing wall 4. The pressure of the air 7 regulated by the electropneumatic regulator is approximately 200 kPa to 500 kPa. Such pressure is pressure necessary to suppress a discharge of 1200 V to 6.5 kV based on Paschen's law. The electropneumatic regulator is electrically connected to the semiconductor test apparatus, and regulates the pressure of the air 7 so that the air 7 is at pressure set by the semiconductor test apparatus.

As illustrated in FIG. 5, from among cross-sectional areas of parts from the air tube 6 to the opening of the pressurizing wall 4 through which the air 7 passes, a cross-sectional area of the joint 13 through which the air passes is the smallest. To increase the pressure in the opening of the pressurizing wall 4, the amount of air 7 forced into the opening of the pressurizing wall 4 is required to be greater than the amount of air escaping from the pressurizing wall 4. To this end, a cross-sectional area (an outlet area) when the air escapes from the pressurizing wall 4 is set to be smaller than a cross-sectional area (an inlet area) of the joint 13 through which the air 7 passes. The outlet area can be obtained as the product of an inner perimeter of the pressurizing wall 4 (inner perimeter of the opening) and the length from the lower surface of the pressurizing wall 4 to the tips of the probes. As described above, the probe card 3 and the stage 1 has such a positional relationship that the outlet area is smaller than the inlet area after step S5.

In a method of regulating the pressure in the opening of the pressurizing wall 4, the pressure of the air 7 on an output side of the electropneumatic regulator can be regulated to be set pressure by monitoring the pressure in the electropneumatic regulator. The pressure of the air 7 in the vicinity of the probe card 3, however, is actually lower than the set pressure as a pressure drop is caused in the air tube 6 connecting the electropneumatic regulator and the probe card 3. The pressure in the opening of the pressurizing wall 4 is thus lower than the set pressure.

Figure 7:
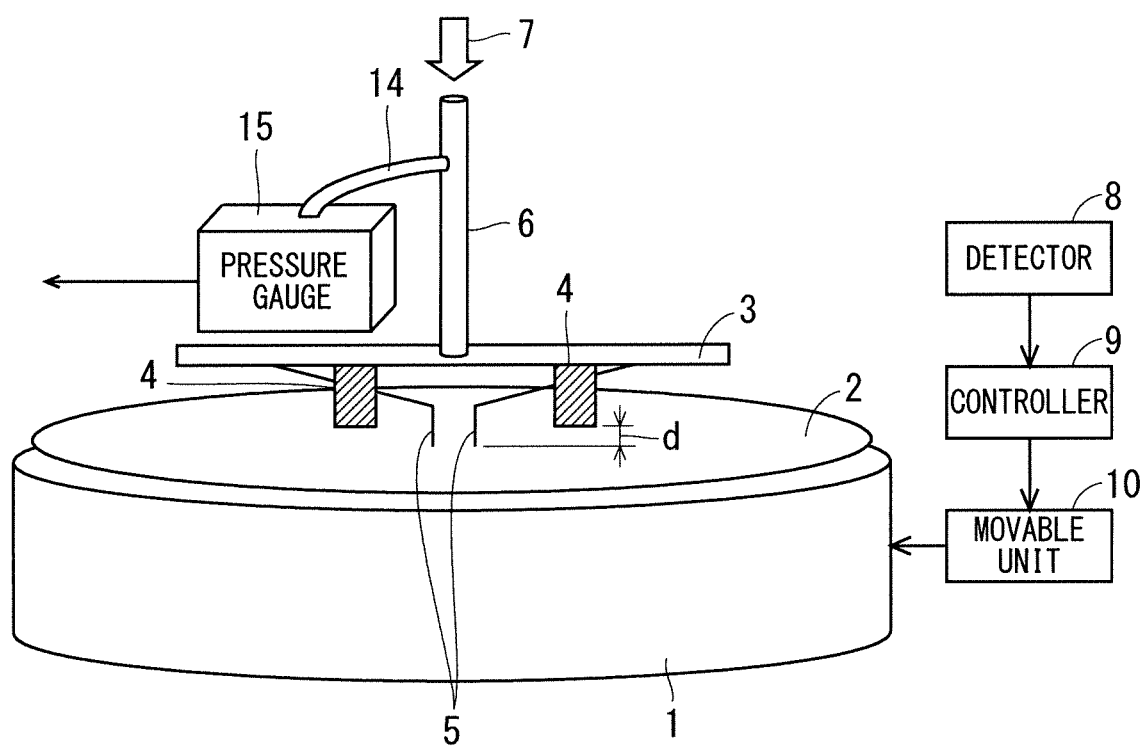
FIG. 7 illustrates an example of a configuration of the semiconductor test apparatus according to the embodiment.
Figure 9:
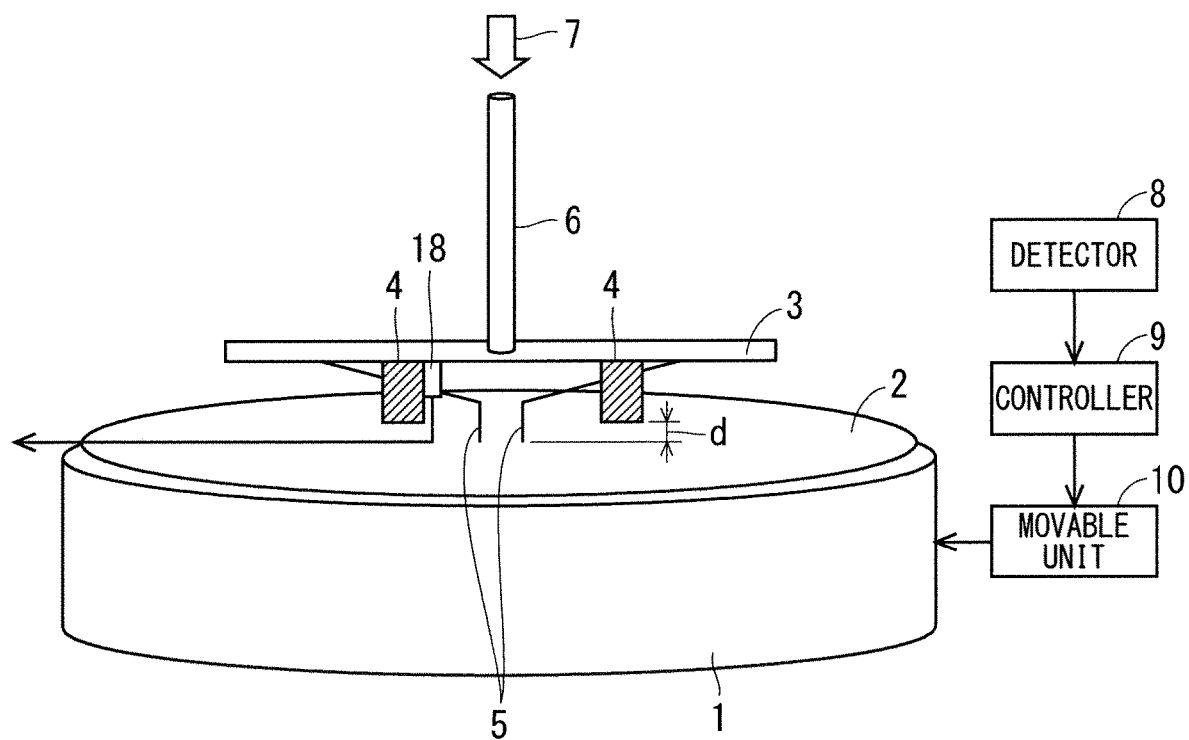
FIG. 9 illustrates an example of a configuration of the semiconductor test apparatus according to the embodiment.

Methods for bringing the pressure in the opening of the pressurizing wall 4 closer to the set pressure are illustrated in FIGS. 7 to 9, for example. A semiconductor test apparatus illustrated in FIG. 7 includes an air tube 14 branching off the air tube 6 in the vicinity of the probe card 3, and connected to a pressure gauge 15. The pressure of the air 7 measured by the pressure gauge 15 is fed back to the electropneumatic regulator, and the pressure of the air 7 output from the electropneumatic regulator can thereby be regulated so that the pressure in the opening of the pressurizing wall 4 is brought closer to the set pressure.

A semiconductor test apparatus illustrated in FIG. 8 includes an air tube 16 (additional tube) having one end connected to the opening of the pressurizing wall 4 and the other end connected to a pressure gauge 17. The pressure of the air 7 in the opening measured by the pressure gauge 17 is fed back to the electropneumatic regulator, and the pressure of the air 7 output from the electropneumatic regulator can thereby be regulated so that the pressure in the opening is brought closer to the set pressure. Pressure at a location closer to the chip 12 can thereby be managed.

A semiconductor test apparatus illustrated in FIG. 9 includes a piezoelectric element 18 disposed, as a pressure sensor, in the opening of the pressurizing wall 4. The pressure of the air 7 in the opening measured by the piezoelectric element 18 is fed back to the electropneumatic regulator, and the pressure of the air 7 output from the electropneumatic regulator can thereby be regulated so that the pressure in the opening is brought closer to the set pressure. The pressure in the opening of the pressurizing wall 4 can thereby be managed with higher accuracy.

When the pressure regulated by the electropneumatic regulator reaches the set pressure, measurement of a breakdown voltage of each of the chips 12 (subjects) of the wafer is started in step S7. When measurement of a breakdown voltage of one of the chips 12 ends, the stage 1 or the probe card 3 is moved to measure a breakdown voltage of another one of the chips 12 while the air 7 is forced into the opening of the pressurizing wall 4, and measurement of the breakdown voltage of the other one of the chips 12 is started.

Figure 10:
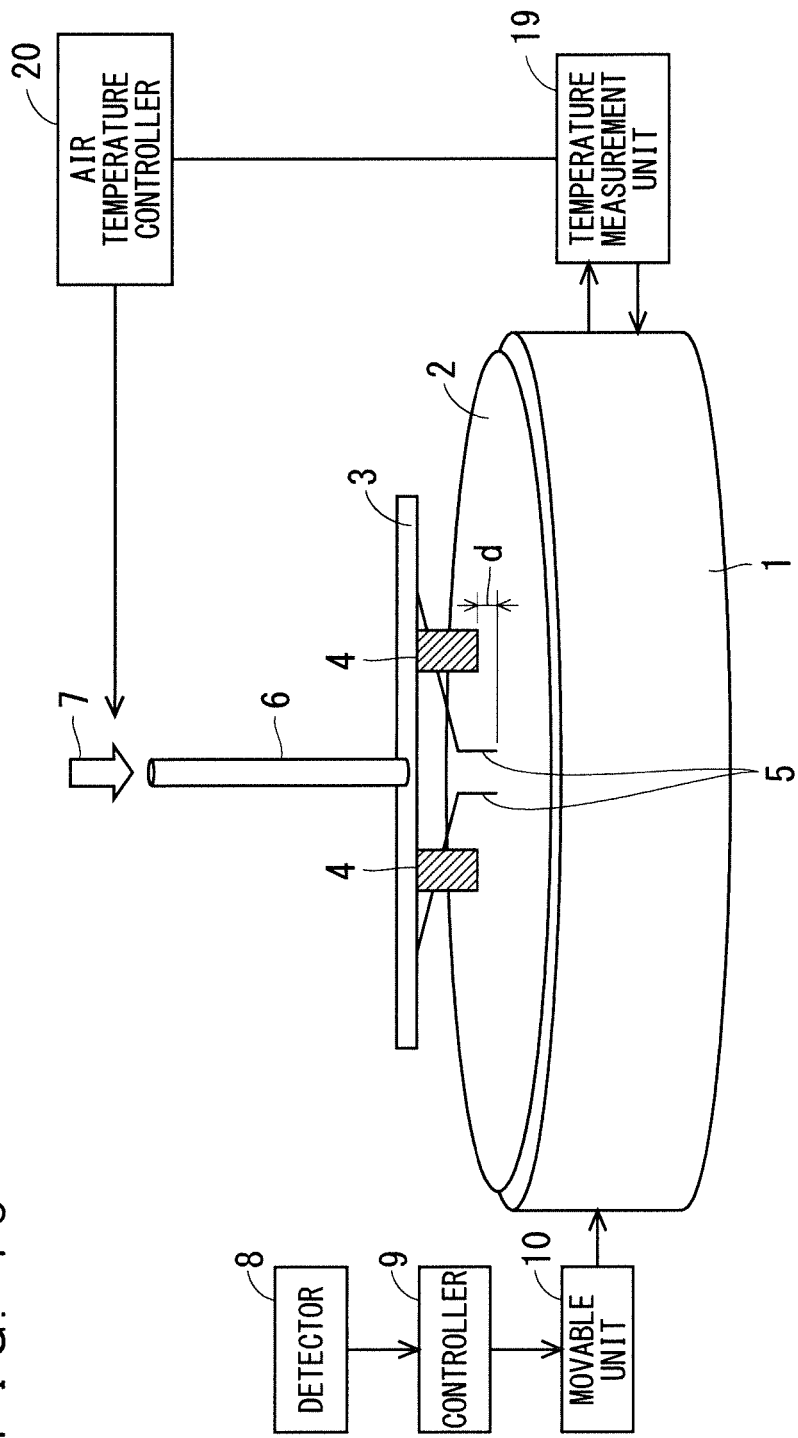
FIG. 10 illustrates an example of a configuration of the semiconductor test apparatus according to the embodiment.

When the breakdown voltage is measured at a high temperature, the temperature of the chips 12 and the stage 1 can be lower than a set temperature due to the air 7. To address the problem, as illustrated in FIG. 10, a temperature measurement unit 19 to measure the temperature of the stage 1 and an air temperature controller 20 to control the temperature of the air 7 based on the temperature measured by the temperature measurement unit 19 may be included. In this case, the air temperature controller 20 can perform control so that the air 7 regulated at the temperature of the stage or the set temperature is forced into the opening of the pressurizing wall 4. The surface of each of the chips 12 can thereby be maintained at a desired temperature.

Effects

According to the semiconductor test apparatuses described above, the breakdown voltage test can be conducted on the semiconductor devices while they are in wafer form. In particular, in a semiconductor device including SiC (silicon carbide), a discharge is likely to occur at a rated voltage or more as a terminal of a chip can be shrunk. The breakdown voltage test can be conducted on such a semiconductor device while the discharge is suppressed.

Embodiments can freely be combined with each other, and can be modified or omitted as appropriate within the scope of the present disclosure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor test apparatus comprising:
    a stage on which a wafer including a plurality of subjects is to be mounted;
    a probe card disposed above the stage;
    a pressurizing wall disposed on a surface of the probe card opposing the stage, extending toward the stage, and having an opening;
    a mark disposed on a lower surface of the pressurizing wall, the lower surface being a surface of the pressurizing wall opposing the stage;
    a probe disposed in the opening;
    a tube to force air into the opening;
    a detector to detect first spacing between a tip of the probe and the mark; and
    a controller to control second spacing between the wafer and the lower surface of the pressurizing wall based on the first spacing detected by the detector, wherein
    when an electrical property of each of the subjects of the wafer is measured, the second spacing is controlled to be predetermined spacing by the controller, and the air is forced into the opening through the tube.

2. The semiconductor test apparatus according to claim 1, further comprising
    a movable unit to move at least one of the stage and the probe card in a direction in which the stage and the probe card oppose each other.

3. The semiconductor test apparatus according to claim 1, wherein
    the probe card has a through hole leading to the opening,
    the tube is connected to the through hole through a joint, and
    an outlet area is smaller than an inlet area, the inlet area being a cross-sectional area of the joint through which the air passes, the outlet area being a product of an inner perimeter of the pressurizing wall and a length from the lower surface of the pressurizing wall to the tip of the probe.

4. The semiconductor test apparatus according to claim 1, further comprising
    an additional tube having one end connected to the opening and the other end connected to a pressure gauge.

5. The semiconductor test apparatus according to claim 1, further comprising
    a pressure sensor disposed in the opening to measure pressure in the opening.

6. The semiconductor test apparatus according to claim 1, further comprising:
    a temperature measurement unit to measure a temperature of the stage; and
    an air temperature controller to control a temperature of the air based on the temperature measured by the temperature measurement unit.

7. The semiconductor test apparatus according to claim 1, wherein
    the predetermined spacing is 50 µm to 130 µm.

8. A semiconductor test method of measuring the electrical property of each of the subjects of the wafer using the semiconductor test apparatus according to claim 1, the semiconductor test method comprising:
    (a) mounting the wafer on the stage;
    (b) calculating the second spacing between the wafer and the lower surface of the pressurizing wall based on the first spacing detected by the detector;
    (c) bringing the stage and the probe card into proximity based on the second spacing calculated in the step (b);

(d) forcing the air into the opening through the tube to increase pressure in the opening; and
(e) measuring the electrical property of each of the subjects of the wafer.

* * * * *